US006649466B2

(12) United States Patent
Basceri et al.

(10) Patent No.: US 6,649,466 B2
(45) Date of Patent: Nov. 18, 2003

(54) METHOD OF FORMING DRAM CIRCUITRY

(75) Inventors: Cem Basceri, Boise, ID (US); Garo J. Derderian, Boise, ID (US); M. R. Visokay, Richardson, TX (US); J. M. Drynan, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/243,385

(22) Filed: Sep. 13, 2002

(65) Prior Publication Data
US 2003/0017680 A1 Jan. 23, 2003

Related U.S. Application Data

(62) Division of application No. 09/827,759, filed on Apr. 6, 2001.

(51) Int. Cl.[7] .......................................... H01L 21/8242
(52) U.S. Cl. ...................................................... 438/240
(58) Field of Search ................................ 438/253, 239, 438/240

(56) References Cited

U.S. PATENT DOCUMENTS

| | | | | |
|---|---|---|---|---|
| 5,292,673 A | * | 3/1994 | Shinriki et al. | 438/287 |
| 5,486,488 A | | 1/1996 | Kamiyama | |
| 5,641,702 A | | 6/1997 | Imai et al. | 438/396 |
| 5,726,083 A | * | 3/1998 | Takaishi | 438/210 |
| 5,893,734 A | * | 4/1999 | Jeng et al. | 438/239 |
| 6,117,725 A | | 9/2000 | Huang | 438/241 |
| 6,200,893 B1 | | 3/2001 | Sneh | 438/685 |
| 6,235,572 B1 | | 5/2001 | Kunitomo et al. | 438/240 |
| 6,399,438 B2 | * | 6/2002 | Saito et al. | 438/253 |

OTHER PUBLICATIONS

Bin Yu, et al., "70nm MOSFET with Ultra–Shallow, Abrupt, and Super–Doped S./D Extension Implemented by Laser ThermalProcess (LTP)", IEEE, Mar. 1999.
Somit Talwar, et al., "Ultra–Shallow, Abrupt, and Highly–Activated Junctions by Low–Energy Ion Implantation and Laser Annealing", Verdant Technologies, San Jose, CA.
Ken–ichi Goto, et al., "Ultra–Low Contact Resistance for Deca–nm MOSFETs by Laser Annealing", IEEE, Sep. 1999, pp. 20.7.1–20.7.3.

* cited by examiner

Primary Examiner—David Nelms
Assistant Examiner—Thao Le
(74) Attorney, Agent, or Firm—Wells St. John P.S.

(57) ABSTRACT

In part, disclosed are semiconductor processing methods, methods of depositing a tungsten comprising layer over a substrate, methods of depositing a tungsten nitride comprising layer over a substrate, methods of depositing a tungsten silicide comprising layer over a substrate, methods of forming a transistor gate line over a substrate, methods of forming a patterned substantially crystalline $Ta_2O_5$ comprising material, and methods of forming a capacitor dielectric region comprising substantially crystalline $Ta_2O_5$ comprising material. In one implementation, a semiconductor processing method includes forming a substantially amorphous $Ta_2O_5$ comprising layer over a semiconductive substrate. The layer is exposed to $WF_6$ under conditions effective to etch substantially amorphous $Ta_2O_5$ from the substrate. In one implementation, the layer is exposed to $WF_6$ under conditions effective to both etch substantially amorphous $Ta_2O_5$ from the substrate and deposit a tungsten comprising layer over the substrate during the exposing.

11 Claims, 7 Drawing Sheets

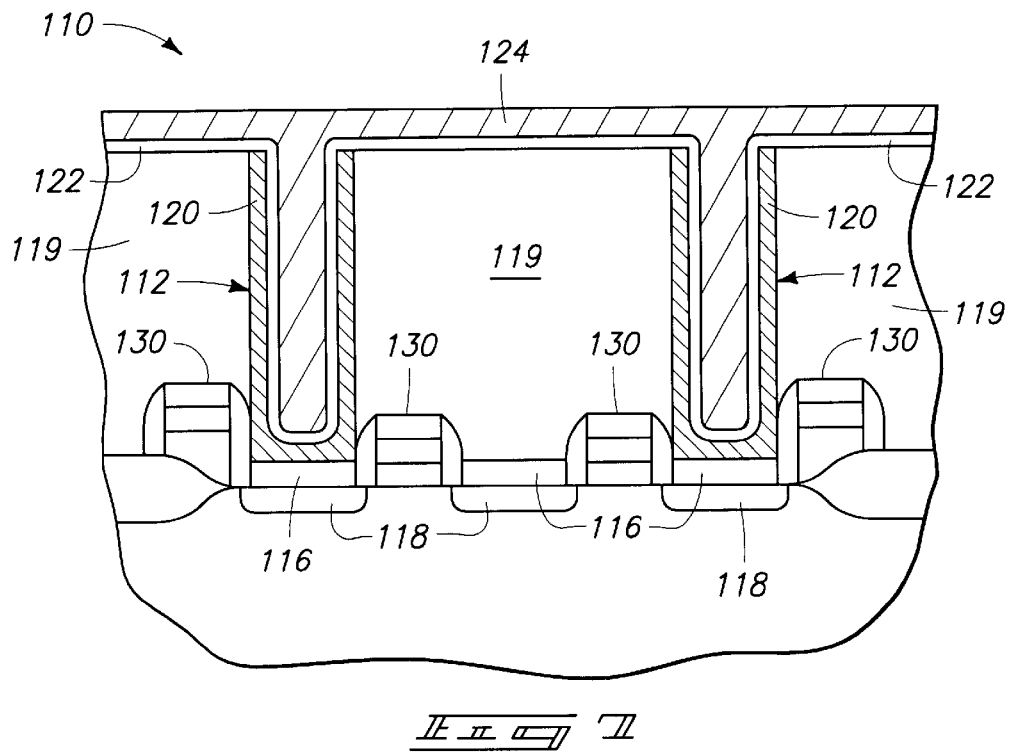
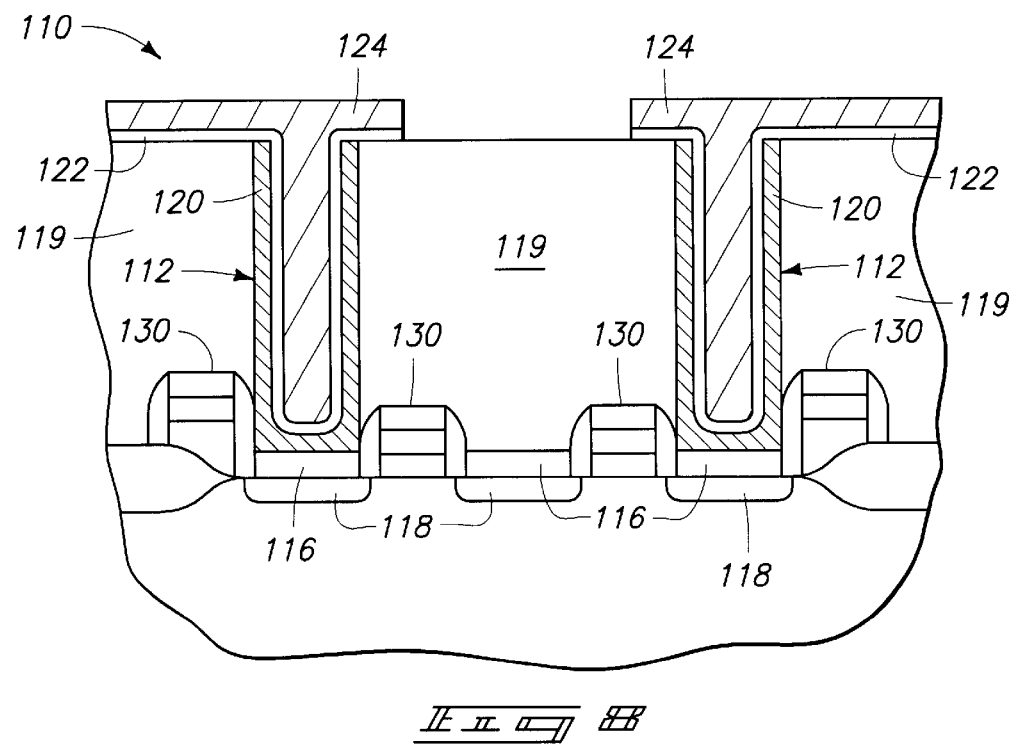

US 6,649,466 B2

METHOD OF FORMING DRAM CIRCUITRY

CROSS REFERENCE TO RELATED APPLICATION

This application is a divisional of U.S. patent application Ser. No. 09/827,759, which was filed on Apr. 6, 2001, and which is incorporated by reference herein.

TECHNICAL FIELD

The invention relates to semiconductor processing methods, to methods of forming DRAM circuitry, to methods of depositing a tungsten comprising layer over a substrate, to methods of forming a transistor gate line over a substrate, to methods of forming a transistor gate line over a substrate, to methods of forming a patterned substantially crystalline $Ta_2O_5$ comprising material, and to methods of forming a capacitor dielectric region comprising substantially crystalline $Ta_2O_5$ comprising material.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs and beyond will be on the order of 0.25 micron or less, and conventional dielectrics such as $SiO_2$ and $Si_3N_4$ might not be suitable because of low dielectric constants.

Highly integrated memory devices are expected to require a very thin dielectric film for the 3-dimensional capacitor of cylindrically stacked or trench structures. To meet this requirement, the capacitor dielectric film thickness will be below 2.5 nm of $SiO_2$ equivalent thickness.

Insulating inorganic metal oxide materials (such as ferroelectric materials, perovskite materials and pentoxides) are commonly referred to as "high k" materials due to their high dielectric constants, which make them attractive as dielectric materials in capacitors, for example for high density DRAMs and non-volatile memories. Using such materials enables the creation of much smaller and simpler capacitor structures for a given stored charge requirement, enabling the packing density dictated by future circuit design. One such material is tantalum pentoxide.

Tungsten, in desired elemental or compound forms, is a conductive material finding increasing use in the fabrication of circuit devices. The semiconductor industry continues to search for new and hopefully improved ways of depositing or otherwise forming tungsten materials onto a substrate.

SUMMARY

The invention comprises semiconductor processing methods, methods of forming DRAM circuitry, methods of depositing a tungsten comprising layer over a substrate, methods of depositing an elemental tungsten comprising layer over a substrate, methods of depositing a tungsten nitride comprising layer over a substrate, methods of depositing a tungsten silicide comprising layer over a substrate, methods of forming a transistor gate line over a substrate, methods of forming a patterned substantially crystalline $Ta_2O_5$ comprising material, and methods of forming a capacitor dielectric region comprising substantially crystalline $Ta_2O_5$ comprising material. In one implementation, a semiconductor processing method includes forming a substantially amorphous $Ta_2O_5$ comprising layer over a semiconductive substrate. The layer is exposed to $WF_6$ under conditions effective to etch substantially amorphous $Ta_2O_5$ from the substrate. In one implementation, the layer is exposed to $WF_6$ under conditions effective to both etch substantially amorphous $Ta_2O_5$ from the substrate and deposit a tungsten comprising layer over the substrate during the exposing. In one implementation, aspects of the invention are used to fabricate a transistor gate line. In one implementation, aspects of the invention are used to fabricate DRAM circuitry.

BRIEF DESCRIPTION OF THE DRAWINGS

Preferred embodiments of the invention are described below with reference to the following accompanying drawings.

FIG. 7 is a diagrammatic sectional view of yet another alternate embodiment semiconductor wafer fragment at a processing step in accordance with an aspect of the invention.

FIG. 8 is a view of the FIG. 7 wafer fragment at a processing step subsequent to that shown by FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
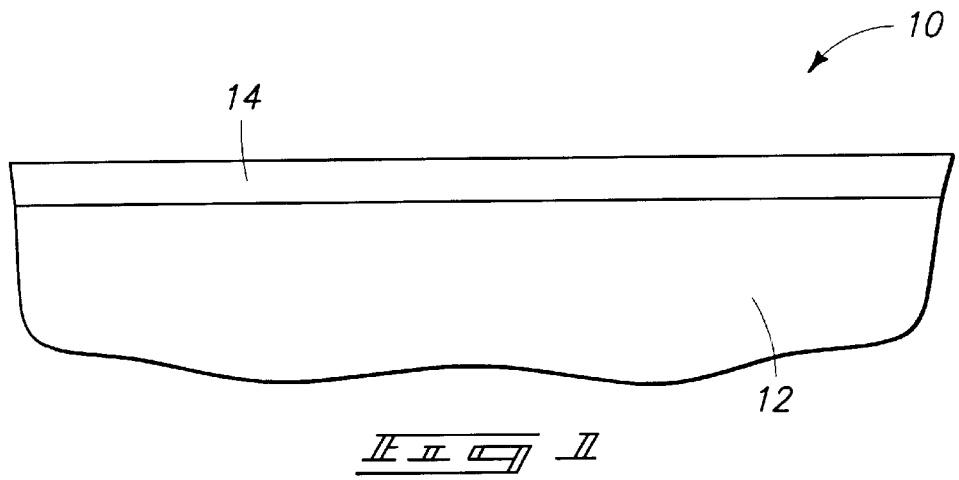
FIG. 1 is a diagrammatic sectional view of a semiconductor wafer fragment at one processing step in accordance with an aspect of the invention.

Referring to FIG. 1, a semiconductive substrate is indicated generally with reference numeral 10, and comprises bulk monocrystalline silicon 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" includes both the singular and the plural unless otherwise indicated.

A substantially amorphous $Ta_2O_5$ layer 14 is formed over substrate 12. The preferred method for forming layer 14 is by chemical vapor deposition, for example, using $Ta(OC_2H_5)_5$ and $O_2$ as precursors at an exemplary susceptor temperature range from 400° C. to 550° C. and an exemplary ambient pressure from 100 mTorr to 20 Torr. Further in the preferred embodiment, layer 14 preferably consists essentially of substantially amorphous $Ta_2O_5$. In the context of this document, "substantially amorphous" means at least 95% amorphous phase whereas "substantially crystalline" means at least 95% crystalline phase.

Figure 2:
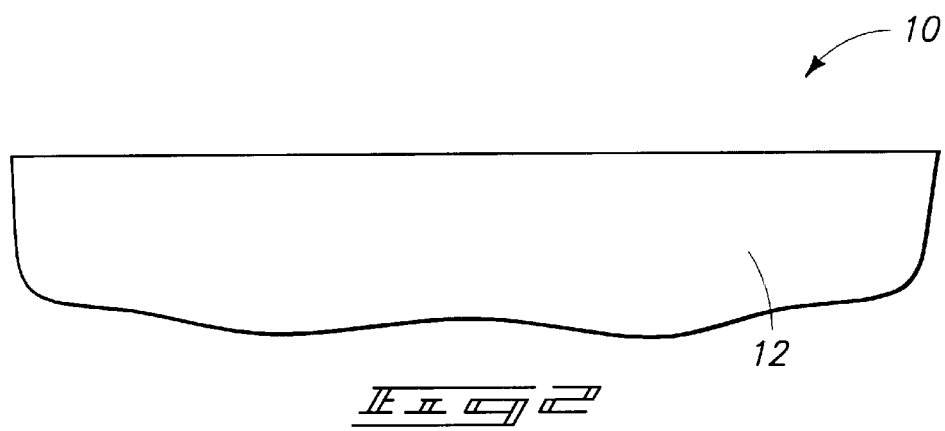
FIG. 2 is a view of the FIG. 1 wafer fragment at a processing step subsequent to that shown by FIG. 1.

Referring to FIG. 2, layer 14 has been exposed to $WF_6$ under conditions effective to etch substantially amorphous $Ta_2O_5$ from the substrate. In the illustrated and preferred example, such exposing is effective to etch substantially all of the substantially amorphous $Ta_2O_5$ comprising layer from the substrate, although less than total removal is, of course, contemplated. Preferred conditions comprise a temperature of at least 350° C., and more preferably a temperature of at least 400° C. Pressure is preferably subatmospheric, with an exemplary preferred range being from 5 mTorr to 10 Torr. In one preferred embodiment, the exposing comprises an atmosphere which consists essentially of $WF_6$. An exemplary flow rate in a 6-liter reactor is from 100 sccm to 500 sccm. An exemplary etch rate at about 400° C. and 5 Torr at this flow rate is from about 10 to 50 Angstroms/minute. Reduction to practice under such conditions evidenced etching of substantially amorphous $Ta_2O_5$ with no appreciable etching of substantially crystalline $Ta_2O_5$. Accordingly in the preferred embodiment, the subject etching is "substantially selective" relative to any presence of crystalline $Ta_2O_5$ on the substrate which, in the context of this document, means an etch rate of at least 3:1, with significantly greater selectivity having been achieved (i.e., on the order of 1000:1). Carrier or other reactive or non-reactive gasses might be utilized. Any of the processing described herein might be conducted with or without plasma, either remotely or within the chamber in which the substrate is received.

Etching alone of the $Ta_2O_5$ layer might occur, or a combination of etching and deposition of a material commensurate with etching. In one embodiment, provision of hydrogen (in $H_2$ or other form) within the chamber during processing can result in deposition of tungsten or a tungsten compound in addition to etching of amorphous $Ta_2O_5$. Conversely in one embodiment, absence of hydrogen (in $H_2$ or other form) within the chamber during processing can result in etching of amorphous $Ta_2O_5$ without deposition of tungsten or a tungsten compound.

Figure 3:
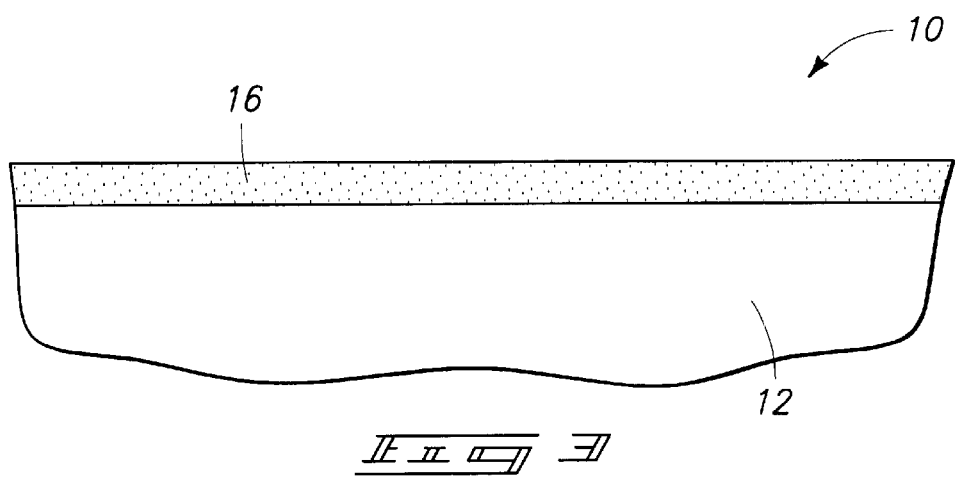
FIG. 3 is a view of the FIG. 1 wafer fragment at a processing step subsequent to that shown by FIG. 1 and alternate to that shown by FIG. 2.

FIG. 3 illustrates an alternate embodiment to that depicted by FIG. 2. Here, layer 14 (FIG. 1) has been exposed to $WF_6$ under conditions effective to both etch substantially amorphous $Ta_2O_5$ from the substrate and deposit a tungsten comprising layer 16 over the substrate during the exposing. In the illustrated and preferred embodiment, the exposing is effective to etch substantially all of the substantially amorphous $Ta_2O_5$ comprising layer 14 from the substrate. In one preferred embodiment, tungsten comprising layer 16 comprises elemental tungsten, and in one embodiment preferably consists essentially of elemental tungsten. In one preferred exemplary process for, etching and forming the same, the $Ta_2O_5$ layer is exposed to $WF_6$ and hydrogen, whether in certain compound, bimolecular or other form. An example process is to flow $H_2$ to the reactor in a same or different stream from the $WF_6$, with an exemplary $H_2$ flow rate being from about 100 sccm to about 1000 sccm. A preferred method of providing the hydrogen to the etching reactor is by first subjecting the hydrogen to a remote plasma such that the hydrogen fed to the reactor for the etching and deposition is in an activated state. Temperature and pressure conditions are otherwise preferably as described above with respect to the first described embodiment.

In one preferred embodiment, tungsten comprising layer 16 comprises a conductive tungsten compound, and preferably consists essentially of a conductive tungsten compound. One example preferred material is tungsten nitride. Such can be formed by exposing layer 14 to $WF_6$ and nitrogen under conditions effective to both etch substantially amorphous $Ta_2O_5$ from the substrate and deposit a tungsten nitride comprising-layer over the substrate during the exposing. Example forms of nitrogen during the exposing include $NH_3$, $N_2$, $N_2$ plasma (either remote or within the chamber) and $N_2H_2$. Temperature and pressure are otherwise preferably as provided above in the first described embodiment.

By way of example only, another example for layer 16 comprises tungsten silicide. One preferred technique for forming the same comprises exposing the $Ta_2O_5$ layer to $WF_6$ and a silane under conditions effective to both etch substantially amorphous $Ta_2O_5$ from the substrate and deposit a tungsten silicide comprising layer over the substrate during the exposing. By way of example only, exemplary silanes include $SiH_4$, disilane and dichlorosilane. Temperature and pressure conditions are preferably as described above. For dichlorosilane, the substrate temperature is preferably at least 500° C.

In one preferred embodiment, tungsten comprising layer 16 consists essentially of elemental tungsten, a conductive tungsten compound or mixtures thereof.

Reduction-to-practice examples showed depositing of a tungsten comprising layer in the above manner resulted in a higher deposition rate, better uniformity and better adhesion to underlying oxide material beneath the $Ta_2O_5$ than if the $Ta_2O_5$ was not there in the first place. Yet, the invention is in no way limited to these advantageous results unless specifically recited in an accompanying claim.

Figure 4:
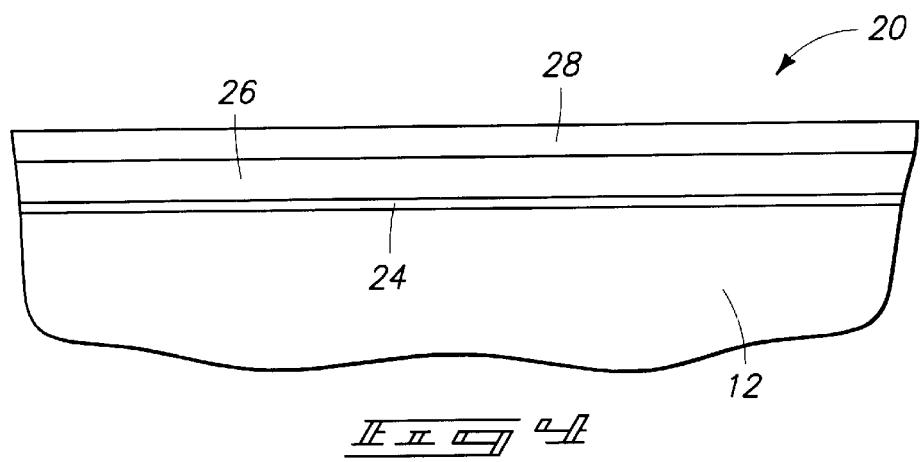
FIG. 4 is a diagrammatic sectional view of an alternate embodiment semiconductor wafer fragment at a processing step in accordance with an aspect of the invention.

In but one aspect, a preferred implementation of the invention comprises a method of forming a transistor gate line over a substrate. A preferred embodiment is described with reference to FIGS. 4–6. FIG. 4 depicts a substrate 20 comprised of a bulk monocrystalline silicon substrate 12. A gate dielectric layer 24, for example silicon dioxide, is formed over semiconductive substrate 12. A conductively doped semiconductive material 26, for example n-type doped polysilicon, is formed over, and preferably on as shown, gate dielectric layer 24. A substantially amorphous $Ta_2O_5$ comprising layer 28 is formed over, and preferably on as shown, conductive semiconductive material 26.

Figure 5:
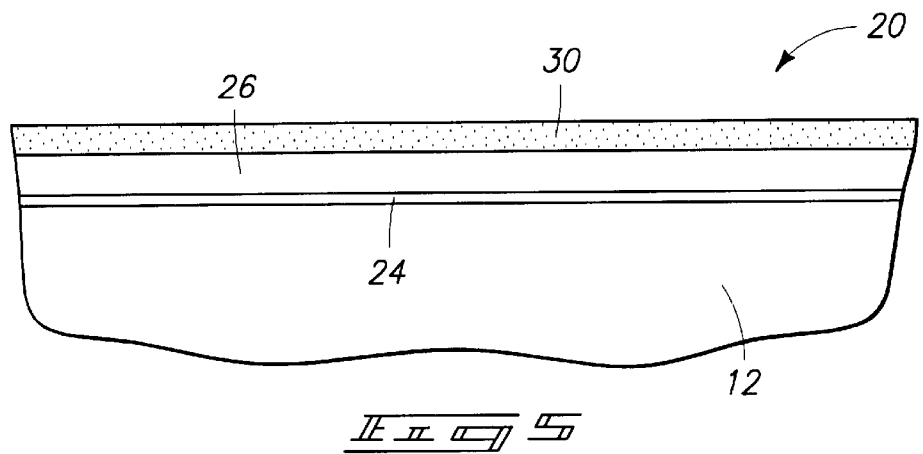
FIG. 5 is a view of the FIG. 4 wafer fragment at a processing step subsequent to that shown by FIG. 4.

Referring to FIG. 5, substantially amorphous $Ta_2O_5$ comprising layer 28 (FIG. 4) has been exposed to $WF_6$ under conditions effective to both remove substantially all of the substantially amorphous $Ta_2O_5$ from the substrate and deposit a conductive tungsten comprising layer 30 in its place over and in electrical connection with conductive semiconductive material 26. Exemplary and preferred processing is as described above.

Figure 6:
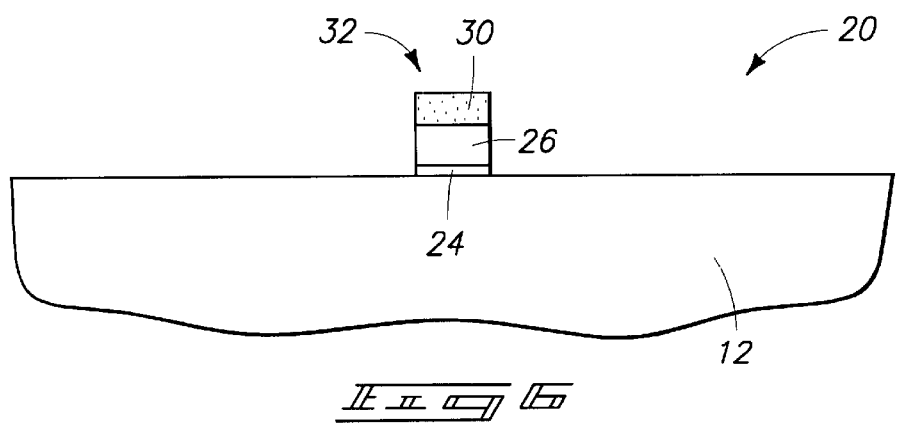
FIG. 6 is a view of the FIG. 4 wafer fragment at a processing step subsequent to that shown by FIG. 5.

Referring to FIG. 6 and after such exposing, at least tungsten comprising layer 30 and conductive semiconductive material 26 are patterned into a transistor gate line 32. Preferred patterning is by photolithography masking and etch.

In but yet another exemplary implementation, a method of DRAM circuitry fabrication is described initially with reference to FIGS. 7–10. Referring to FIG. 7, a wafer fragment 110 comprises two memory cells in fabrication, with each comprising a memory cell storage capacitor 112. Capacitors 112 electrically connect with substrate diffusion regions 118 through polysilicon plug regions 116. Diffusion regions 118 constitute pairs of source/drain regions for individual field effect transistors. Individual storage capacitors 112 comprise a first capacitor electrode 120 in electrical connection with one of a pair of source/drain regions 118 of one field effect transistor. A capacitor dielectric region 122 comprising substantially amorphous $Ta_2O_5$, and preferably consisting essentially thereof, is received over first capacitor electrode 120 and an oxide layer 119 within which first capacitor electrodes 120 are received. Second capacitor cell electrode layer 124 is formed over capacitor dielectric region 122.

Referring to FIG. 8, etching is conducted through a capacitor cell electrode layer 124 and capacitor dielectric layer 122 over the illustrated central source/drain region 118 to which ultimate bit line electrical connection is desired.

Figure 9:
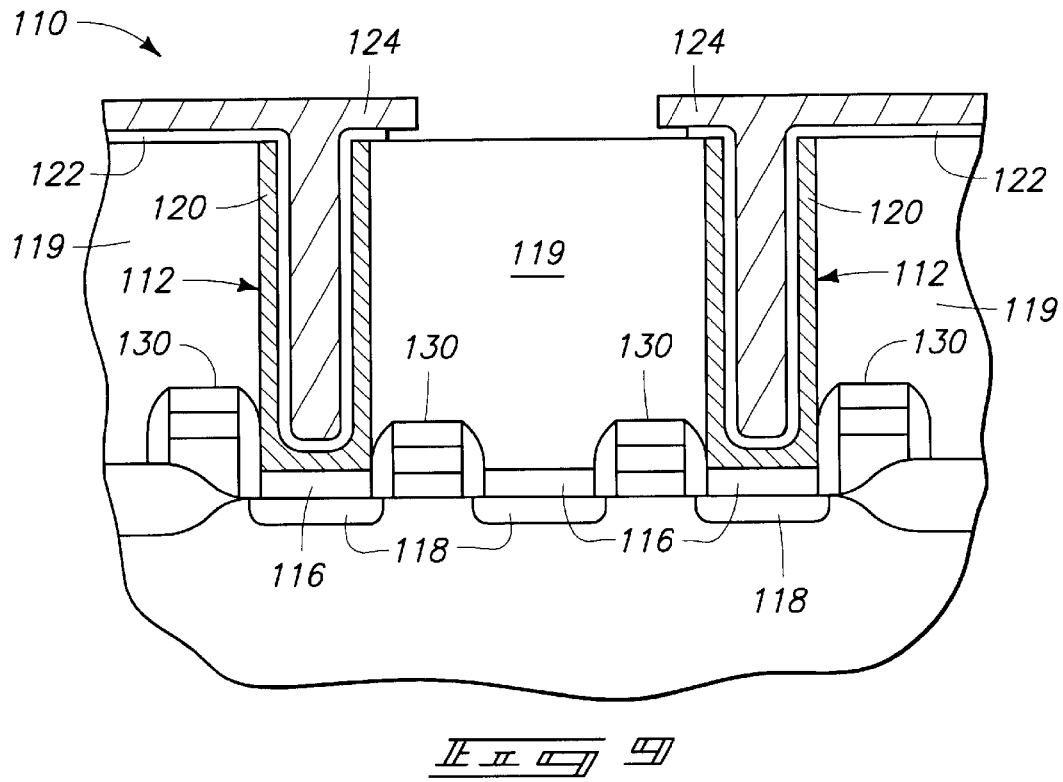
FIG. 9 is a view of the FIG. 7 wafer fragment at a processing step subsequent to that shown by FIG. 8.

Referring to FIG. 9 and after the FIG. 8 etching, exposed portions of capacitor dielectric layer 122 are exposed to $WF_6$ under conditions effective to etch substantially amorphous $Ta_2O_5$ to recess capacitor dielectric layer 122 relative to capacitor cell electrode layer 124. $Ta_2O_5$ capacitor dielectric layers can undesirably result in current leakage to subsequent bit contacting plug material, with the subject recessing preferably providing better separation between a bit contact and the amorphous $Ta_2O_5$.

Figure 10:
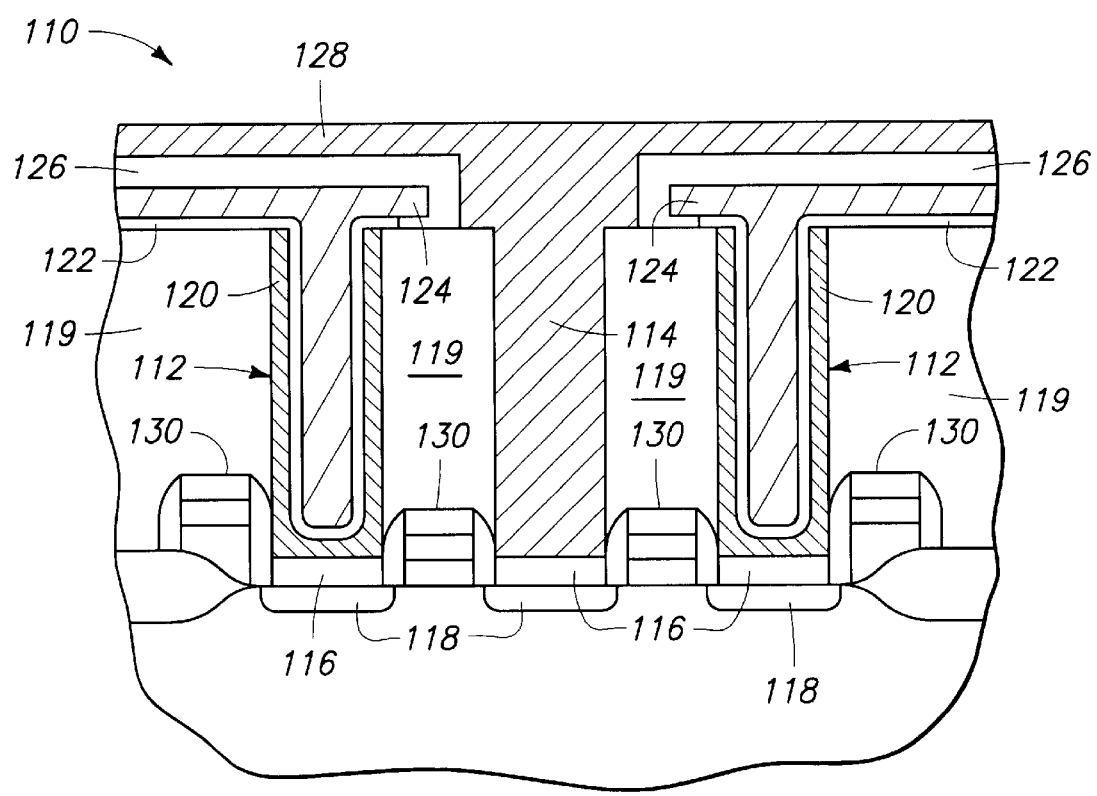
FIG. 10 is a view of the FIG. 7 wafer fragment at a processing step subsequent to that shown by FIG. 9.

Referring to FIG. 10, an insulating layer 126 is formed over cell electrode layer 124. Suitable patterning and etching is then conducted through layers 126 and 119 to provide an exposed contact for making ultimate electrical connection with the illustrated central source/drain diffusion region 118. A bit line 128 of an array of bit lines is subsequently fabricated, providing a bit contact 114 to the illustrated central source/drain region 118. An array of word lines 130 is fabricated to constitute gates of individual field effect transistors to enable selective gating of the capacitors relative to bit contact 114.

Figure 11:
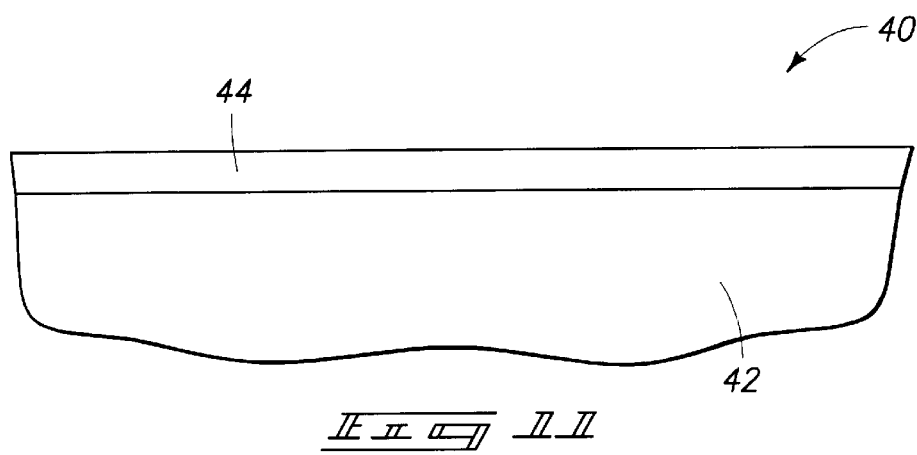
FIG. 11 is a diagrammatic sectional view of still another alternate embodiment semiconductor wafer fragment at a processing step in accordance with an aspect of the invention.

In still but another exemplary implementation, a method of forming a patterned substantially crystalline $Ta_2O_5$ comprising material is described with reference to FIGS. 11–14. Referring initially to FIG. 11, an exemplary substrate 40 comprises a bulk substrate 42. A substantially amorphous comprising $Ta_2O_5$ material is formed over substrate 42.

Figure 12:
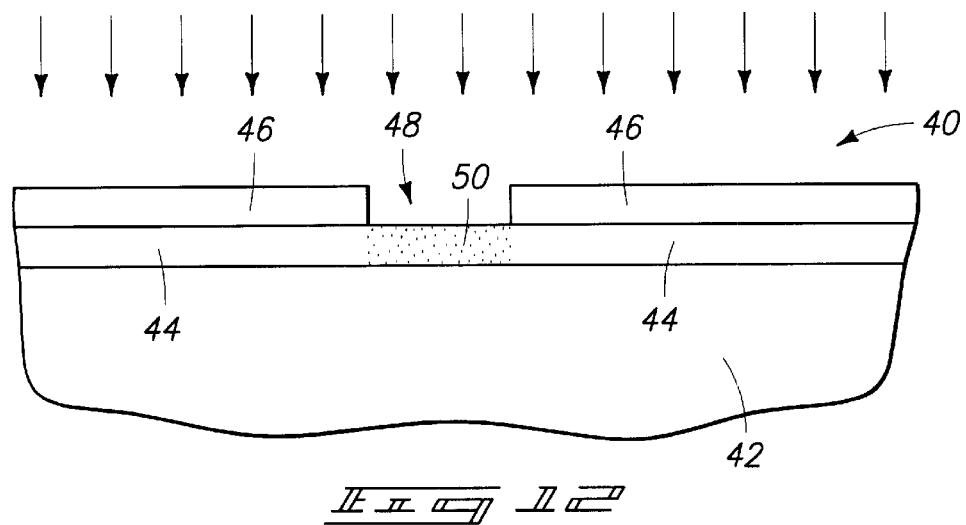
FIG. 12 is a view of the FIG. 11 wafer fragment at a processing step subsequent to that shown by FIG. 11.

Referring to FIG. 12, a masking layer 46 is formed over substantially amorphous comprising $Ta_2O_5$ material 44. Exemplary materials for masking layer 46 include photoresist deposited to exemplary thicknesses of from 1,000 Angstroms to 50,000 Angstroms, and reflective materials such as metals (i.e., Al, Cu, Pt and others) deposited to an exemplary thickness of 100 Å to 10,000 Å underline. At least one opening 48 is formed through masking layer 46 in a desired pattern. A laser is applied, as depicted by the vertical down arrows, to substantially amorphous comprising $Ta_2O_5$ material 44 through opening 48 in masking layer 46, and thereby is provided in the desired pattern depicted by opening 48. The laser application is effective to transform substantially amorphous comprising $Ta_2O_5$ material 44 into a substantially crystalline comprising $Ta_2O_5$ material 50 of the desired pattern. An example laser is a XeCl excimer laser. Example fluence for the energy application is preferably somewhere from 0.1 $J/cm^2$ to 1.0 $J/cm^2$, with a more preferred range being from 0.2 $J/cm^2$ to 0.6 $J/cm^2$. Pulse length is selected depending upon the energy to be effective to achieve the desired amorphous to crystalline phase transformation.

Figure 13:
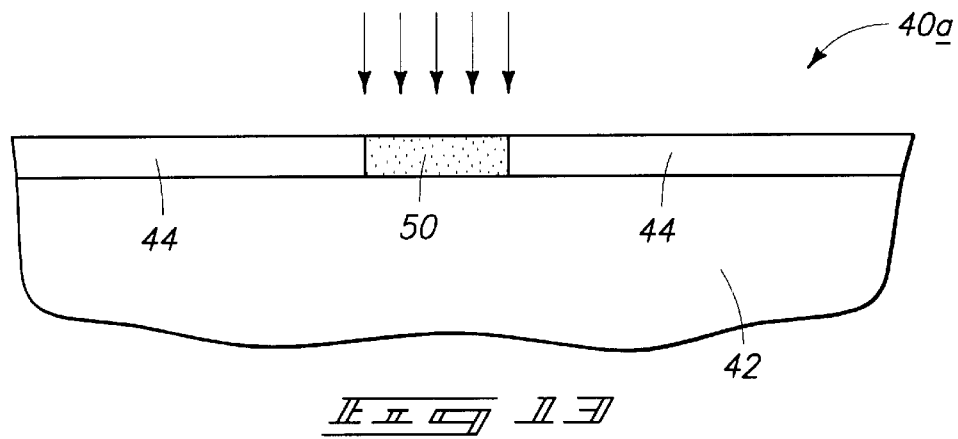
FIG. 13 is a view of the FIG. 11 wafer fragment at an alternate processing step to that shown by FIG. 12.

FIG. 12 provides one preferred example of applying a laser to substantially amorphous comprising $Ta_2O_5$ material 44 in a desired pattern at least in part by using a masking layer having one or more openings therein. FIG. 13 depicts an alternate example 40*a* where a masking layer is not used, with the application of the laser being targeted to the specific area where crystalline phase transformation is desired.

Figure 14:
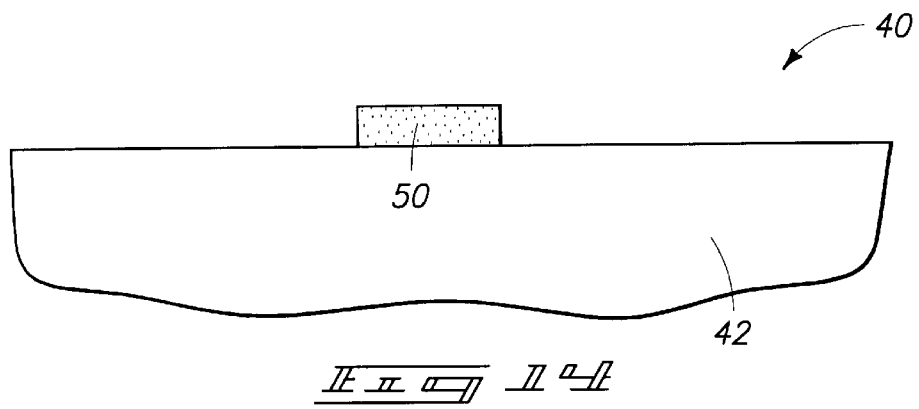
FIG. 14 is a view of the FIG. 11 wafer fragment at a processing step subsequent to that shown by FIG. 12.

Referring to FIG. 14, substantially amorphous comprising $Ta_2O_5$ material 44 is removed from the substrate. In the depicted embodiment, substantially all of the remaining substantially amorphous comprising $Ta_2O_5$ material 44 has been removed, with the preferred technique being chemical etching. Further, most preferred is chemical etching by any of the above-described techniques utilizing $WF_6$, and particularly under conditions effective to substantially selectively etch substantially amorphous comprising $Ta_2O_5$ material from the substrate relative to substantially crystalline comprising $Ta_2O_5$ material. Further by way of example only, such exposing to $WF_6$ can be under conditions effective to both etch substantially amorphous $Ta_2O_5$ from the substrate and deposit a tungsten comprising layer over the substrate during the exposing.

Figure 15:
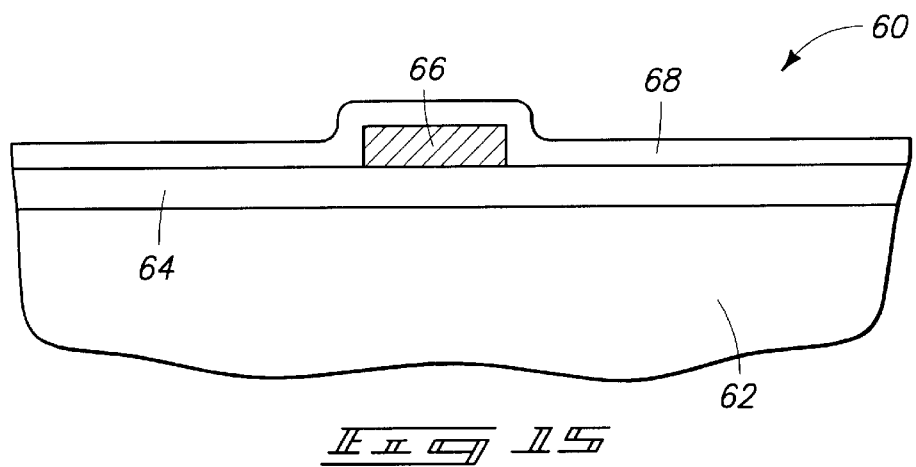
FIG. 15 is a diagrammatic sectional view of another alternate embodiment semiconductor wafer fragment at a processing step in accordance with an aspect of the invention.

Yet another implementation is described with references to FIGS. 15–18 of a method of forming a capacitor having a capacitor dielectric region comprising substantially crystalline $Ta_2O_5$ comprising material. FIG. 15 depicts a substrate 60 comprising bulk semiconductive material 62 having an insulative or other layer 64 formed thereover. A first capacitor electrode 66 is formed over substrate 62/64. A substantially amorphous comprising $Ta_2O_5$ comprising material 68 is formed over first capacitor electrode 66 and substrate 62/64.

Figure 16:
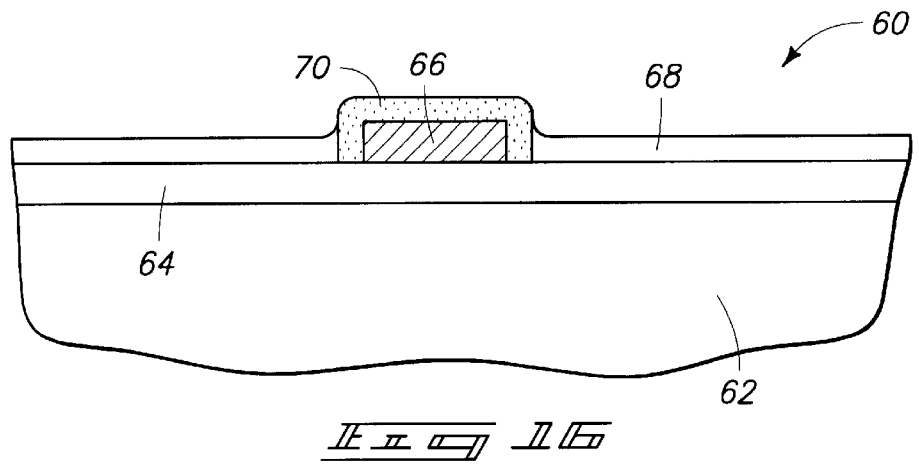
FIG. 16 is a view of the FIG. 15 wafer fragment at a processing step subsequent to that shown by FIG. 15.

Referring to FIG. 16, a laser has been applied to substantially amorphous comprising $Ta_2O_5$ material 68 at least over first capacitor electrode 66 effective to transform substantially amorphous comprising $Ta_2O_5$ material received over first capacitor electrode 66 into a substantially crystalline comprising $Ta_2O_5$ material 70 received over first capacitor electrode 66. Exemplary techniques for doing so include those described above.

Figure 17:
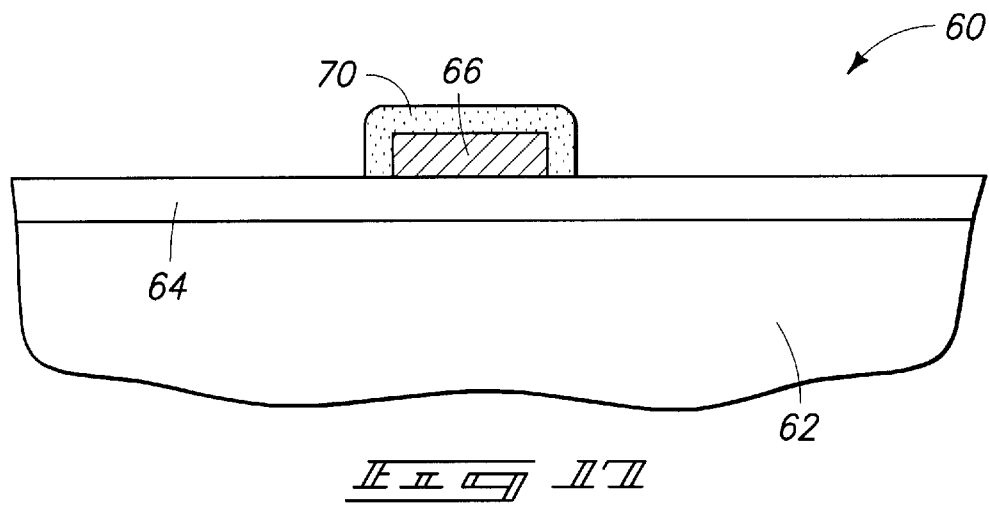
FIG. 17 is a view of the FIG. 15 wafer fragment at a processing step subsequent to that shown by FIG. 16.

Referring to FIG. 17, and after the laser application, the substantially crystalline comprising $Ta_2O_5$ material and the substantially amorphous comprising $Ta_2O_5$ material have been exposed to $WF_6$ under conditions effective to substantially selectively etch substantially amorphous comprising $Ta_2O_5$ material from the substrate relative to substantially crystalline comprising $Ta_2O_5$ material 70. Exemplary and preferred techniques include those described above.

Figure 18:
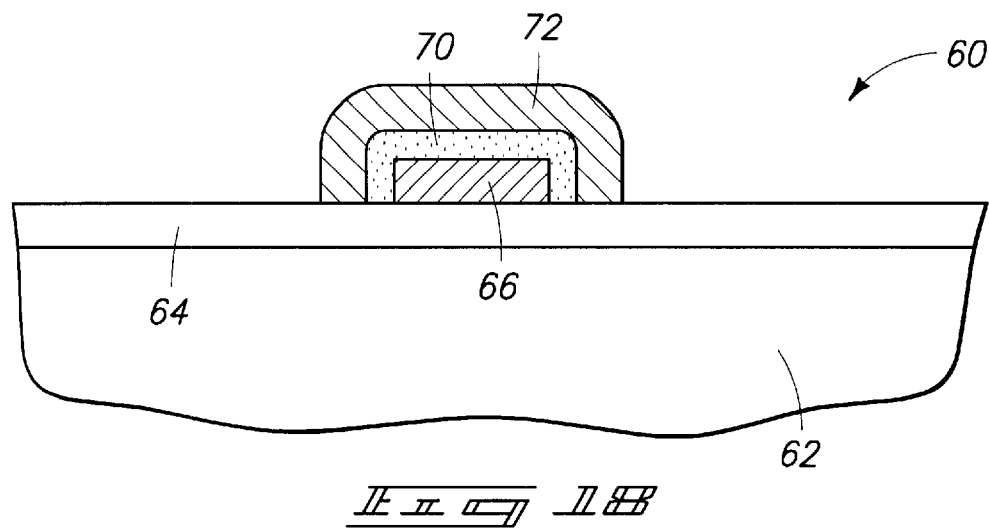
FIG. 18 is a view of the FIG. 15 wafer fragment at a processing step subsequent to that shown by FIG. 17.

Referring to FIG. 18, a second capacitor electrode 72 is formed at least over substantially crystalline comprising $Ta_2O_5$ material 70 received over first capacitor electrode 66. In one embodiment, the forming of the second capacitor electrode might be conducted entirely after the immediately above-described exposing.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming DRAM circuitry comprising:

forming a word line transistor over a semiconductive substrate, the word line transistor having a pair of source/drain regions;

forming a capacitor storage node in electrical connection with one of the source/drain regions;

forming a capacitor dielectric layer over the storage node, the capacitor dielectric layer comprising substantially amorphous $Ta_2O_5$;

forming a capacitor cell electrode layer over the capacitor dielectric layer;

etching through the capacitor cell electrode layer and the capacitor dielectric layer over the other source/drain region; and after the etching, exposing exposed portions of the capacitor dielectric layer to $WE_6$ under conditions effective to etch the substantially amorphous $Ta_2O_5$ to recess the capacitor dielectric layer relative to an overlying layer.

2. The method of claim 1 wherein the overlying layer is at least the capacitor cell electrode layer.

3. The method of claim 1 wherein the etching does not expose the other source/drain region.

4. The method of claim 1 wherein the conditions comprise a temperature of at least 350° C.

5. The method of claim 1 wherein the conditions comprise a temperature of at least 400° C.

6. The method of claim 1 wherein the conditions comprise a temperature of at least 350° C. and subatmospheric pressure.

7. The method of claim 1 wherein the exposing comprises an atmosphere consisting essentially of $WE_6$.

8. The method of claim 1 wherein the capacitor dielectric layer consists essentially of $Ta_2O_5$.

9. The method of claim 1 wherein the exposing comprises an atmosphere essentially void of hydrogen.

10. The method of claim 1 comprising forming a bit line over the word lines.

11. The method of claim 1 comprising after the exposing, forming a bit line.

* * * * *

UNITED STATES PATENT AND TRADEMARK OFFICE
CERTIFICATE OF CORRECTION

PATENT NO.     : 6,649,466 B2
DATED          : November 18, 2003
INVENTOR(S)    : Cem Basceri et al.

It is certified that error appears in the above-identified patent and that said Letters Patent is hereby corrected as shown below:

Column 1,
Lines 14-15, delete first "to methods of forming a transistor gate line over a substrate,"

Column 8,
Line 5, replace "dielectric layer to $WE_6$ under conditions effective to"
with -- dielectric layer to $WF_6$ under conditions effective to --
Line 20, replace "an atmosphere consisting essentially of $WE_6$."
with -- an atmosphere consisting essentially of $WF_6$. --

Signed and Sealed this

Thirteenth Day of July, 2004

JON W. DUDAS
*Acting Director of the United States Patent and Trademark Office*